(12) United States Patent
Phelan et al.

(10) Patent No.: US 7,329,027 B2
(45) Date of Patent: Feb. 12, 2008

(54) HEAT CONDUCTING MOUNTING FIXTURE FOR SOLID-STATE LAMP

(75) Inventors: Giana M. Phelan, Rochester, NY (US); Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/978,190

(22) Filed: Oct. 29, 2004

(65) Prior Publication Data

US 2006/0092641 A1   May 4, 2006

(51) Int. Cl.
*F21V 29/00* (2006.01)
(52) U.S. Cl. .................. 362/294; 362/84; 362/373; 313/46; 313/238; 313/504
(58) Field of Classification Search .......... 362/84, 362/294, 373; 313/238, 46, 504
See application file for complete search history.

(56) References Cited

U.S. PATENT DOCUMENTS

| | | | |
|---|---|---|---|
| 5,857,767 A * | 1/1999 | Hochstein | 362/294 |
| 6,045,240 A | 4/2000 | Hochstein | |
| 6,265,820 B1 * | 7/2001 | Ghosh et al. | 313/483 |
| 6,967,439 B2 * | 11/2005 | Cok et al. | 313/512 |
| 2003/0189829 A1 | 10/2003 | Shimizu et al. | |
| 2003/0222558 A1 | 12/2003 | Cok | |
| 2004/0012328 A1 * | 1/2004 | Arnold et al. | 313/504 |
| 2004/0026721 A1 | 2/2004 | Dry | |
| 2004/0027545 A1 | 2/2004 | Yokoyama et al. | |
| 2004/0060976 A1 | 4/2004 | Blazey et al. | |
| 2005/0134526 A1 * | 6/2005 | Willem et al. | 345/1.3 |
| 2006/0022589 A1 * | 2/2006 | Cok | 313/506 |

FOREIGN PATENT DOCUMENTS

| | | |
|---|---|---|
| DE | 20 2004 012322 | 10/2004 |
| WO | WO 2004/011848 | 2/2004 |

* cited by examiner

*Primary Examiner*—Stephen F. Husar
*Assistant Examiner*—Meghan K. Dunwiddie
(74) *Attorney, Agent, or Firm*—Frank Pincelli

(57) ABSTRACT

An organic light-emitting diode lighting apparatus having an organic light-emitting diode lamp having a thermally conductive mounting member having a mounting surface on a first side and second light-emitting surface and a thin-film light-emitting structure adjacent the second light-emitting surface, the thin-film light-emitting structure comprising an anode, a light-emitting layer, and a cathode, and a thermally conductive mounting fixture having a thermally conductive mounting surface on which the thermally conductive mounting member is secured such that there is substantially continuous thermal contact across the mounting surface.

23 Claims, 5 Drawing Sheets

HEAT CONDUCTING MOUNTING FIXTURE FOR SOLID-STATE LAMP

FIELD OF THE INVENTION

This invention pertains to the field of solid-state light-emitting devices and more specifically to fixtures utilizing said devices for general-purpose illumination.

BACKGROUND OF THE INVENTION

Light-emitting devices (LEDs), both organic and inorganic, offer the promise of more efficient lighting with concomitant societal benefits that accrue from reduced electrical consumption. Although LEDs have theoretical efficiency limits far in excess of current incandescent and fluorescent lamps, they still are hampered by thermal management issues. This seeming paradox exists because existing light bulbs, especially incandescent lamps, convert their waste energy essentially directly into light at near-infrared wavelengths which is radiated from the bulb as out-of-band radiation. In contrast, solid-state lighting devices such as LEDs convert waste energy into thermal excitation of the device substrate. In contrast with incandescent bulbs, which work for the very reason that the filament has been heated to high temperatures, LEDs lose efficiency as the device substrate is heated, further compounding the problem. Because existing lamps have an inherent heat rejection mechanism, there has been no need to date to provide lighting fixtures with a means to manage the heat produced by the bulb. This is not the case for future fixtures that will utilize solid-state lamps.

There is therefore a need for an improved mounting fixture for solid-state lamps that provides heat management functions.

SUMMARY OF THE INVENTION

In accordance with the present invention there is provided an organic light-emitting diode lighting apparatus, comprising:

a) an organic light-emitting diode lamp having a thermally conductive mounting member having a mounting surface on a first side and second light-emitting surface and a thin-film light-emitting structure adjacent the second light-emitting surface, the thin-film light-emitting structure comprising an anode, a light-emitting layer, and a cathode; and b. a thermally conductive mounting fixture having a thermally conductive mounting surface on which the thermally conductive mounting member is secured such that there is substantially continuous thermal contact across the mounting surface.

These and other aspects, objects, features and advantages of the present invention will be more clearly understood and appreciated from a review of the following detailed description of the preferred embodiments and appended claims and by reference to the accompanying drawings.

BRIEF DESCRIPTION OF THE DRAWINGS

In the detailed description of the preferred embodiments of the invention presented below, reference is made to the accompanying drawings in which.

DETAILED DESCRIPTION OF THE INVENTION

Figure 1:
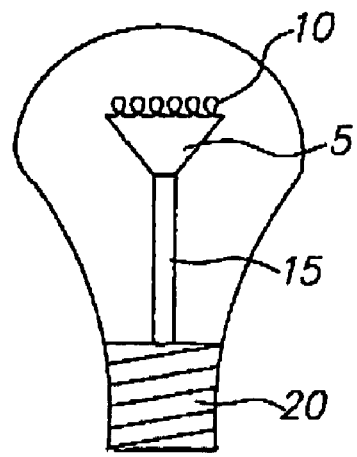
FIG. 1 depicts a typical prior-art incandescent lamp.

Referring to FIG. 1, a typical incandescent lamp is comprised of a sealed envelope 5 mechanically bonded to an Edison screw base 20. A glass filament support 15 is bonded to the bottom of the envelope and electrical leads (not visible in figure) are brought out through the sealed envelope and attached to the Edison screw base. Electrical current is supplied to filament 10 via the leads attached to the base. The fundamental operating principle of this lamp is that the filament is heated by the supplied electrical current to such a temperature that its black-body emission contains a substantial component in the visible light range. The spectrum of this lamp's radiation can be closely approximated by Planck's formula:

$$P_\lambda = \frac{2\pi hc^2}{\lambda^5 (e^{(hc/\lambda kt)} - 1)}$$

$P_\lambda$ = Power per m² area per m wavelength
h = Planck's constant ($6.626 \times 10^{-34}$ Js)
c = Speed of Light ($3 \times 10^8$ m/s)
λ = Wavelength (m)
k = Boltzmann Constant ($1.38 \times 10^{-23}$ J/K)
T = Temperature (K)

Although only about 5% of the input energy is radiated as useful light in the visible spectrum, the remaining energy is still radiated from the bulb, rather than rejected via conduction.

Figure 2:
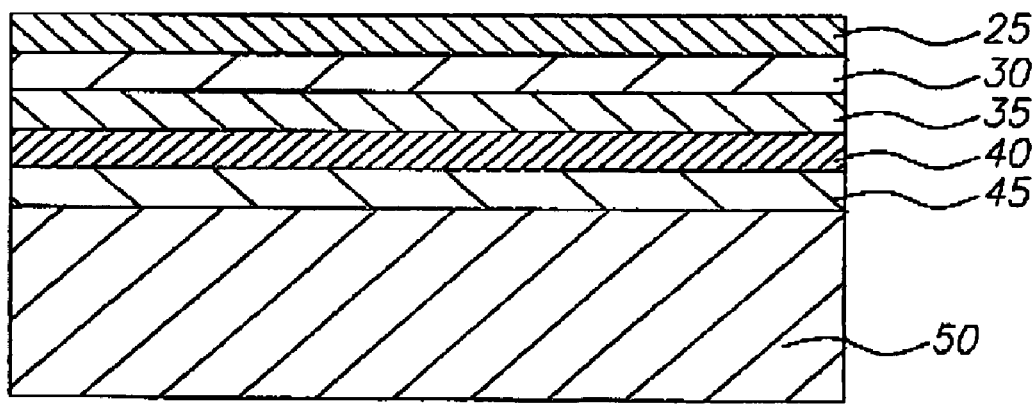
FIG. 2 is a layer diagram of a prior-art organic light-emitting diode.

FIG. 2 shows the structure of a typical prior-art organic light-emitting diode/lamp 55. A series of thin-film layers (~50 nm) are deposited on a substrate 50, typically glass. These layers are a cathode 25, an electron-injection layer 30, an emitter layer 35, a hole-injection layer 40, and an anode 45. A plurality of such layers may be employed in stacks to increase the light emitted from the device. An optional encapsulating cover 52 may be provided over the series of thin-film layers and secured to substrate 50. Alternatively, a thin-film encapsulation may be employed to seal the thin-film layers. Electrical current is applied to the anode 45 and cathode 25. The current flows in the form of holes from the anode and electrons in the cathode. The holes and electrons which meet and recombine in the emitter layer emit a photon—light. Compared to a black-body radiator, the spectrum of this light is narrow. For typical OLED materials, the spectrum can be approximated by a normal distribution. The distribution is generally described by two parameters, the location of the center peak and the width of the distribution at the point that the intensity is half the peak. This is referred to as full-width at half-max, and is typically 30 nm for OLEDs and 15 nm for inorganic LEDs. As a consequence, there is very little energy radiated from the device outside the targeted peak point. The energy of electrons and holes that do not recombine to emit a photon is released into the material as thermal excitation—heat. This heat is released primarily through conduction, with a small amount released as very long wavelength infrared. Unless the device has an efficient conductive interface, its steady-state temperature will be quite high, which leads to decreased efficiency and decreased life.

Figure 3:
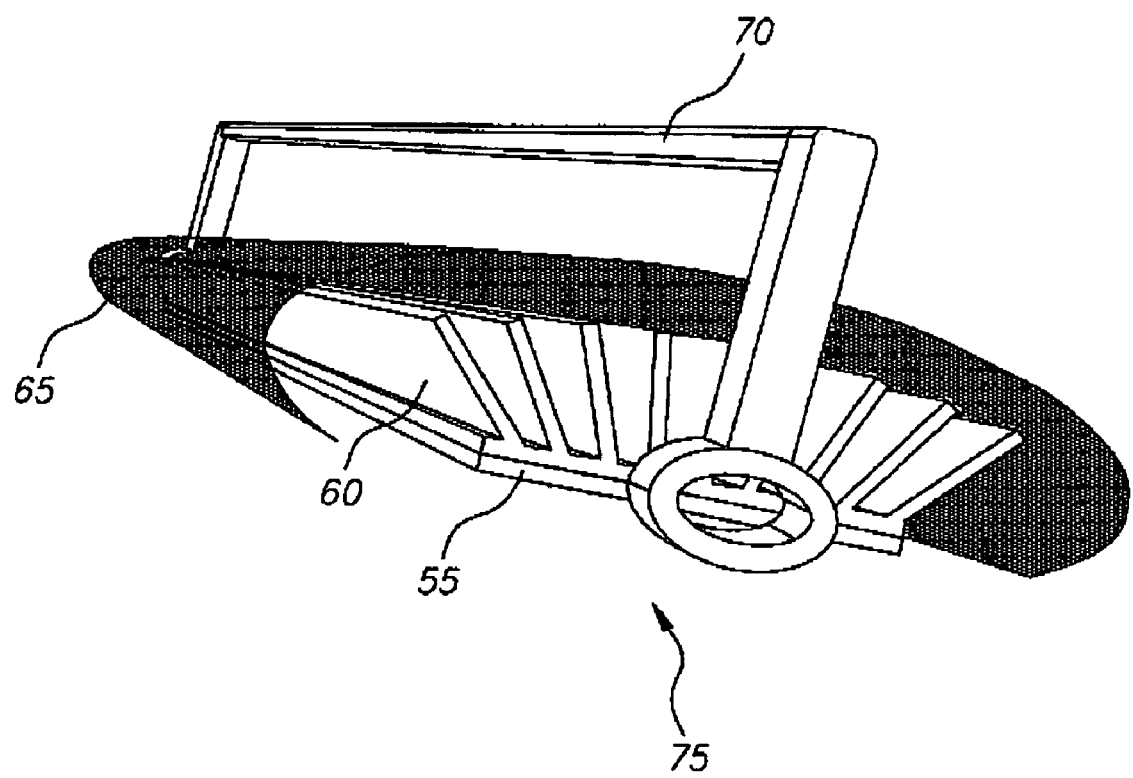
FIG. 3 is a perspective of one embodiment of an organic light-emitting diode lighting apparatus made in accordance with the present invention.

To address this new issue introduced into the use of solid-state lamps in lighting fixtures, this invention introduces into a light fixture a means for improving the heat transfer from the solid-state lamp. Referring to FIG. 3, a luminaire 75, made in accordance with the present invention, is illustrated. The luminaire 75 is comprised of an OLED lamp 55, such as described with respect to FIG. 2, that is removably affixed to a heat transfer unit 60. The heat transfer unit is covered with a screen 65, preferably made of metal, which also provides protection against accidental contact with the heat transfer unit while allowing free circulation of air, which provides convective cooling. The screen may be decorative or may be decorated to improve the appearance of the fixture. A mounting bracket 70 that is pivotally secured to heat transfer unit 60 is provided for attaching the luminaire 75 to a wall, ceiling, post, or other point of fixturing. The OLED lamp is electrically connected to the luminaire via contacts on the lamp and a socket for contact with an external power source (not visible) on the luminaire, as described in U.S. Publication 2003/0222558 published Dec. 4, 2003 to Cok which is incorporated by reference in its entirety. Alternatively, power may be provided through batteries or other local power provision.

In a preferred embodiment, the heat transfer unit 60 includes a heat-conductive compliant surface which is coextensive and in continuous thermal contact with mounting surface 74 of the solid-state light source 55 to improve heat conduction from the solid-state light source. The surface in the embodiment illustrated is provided on the non-emissive side of the solid-state light source. In the absence of a compliant surface largely coextensive and in continuous thermal contact with the solid-state light lamp 55, hot spots may develop in the light lamp 55. The unit 60 in the embodiment illustrated is provided with a plurality of heat conductive fins 62 that draw heat away from the lamp 55. As is known in the art, the lifetime of solid-state lamps is decreased when the lamps are operated at an elevated temperature. Hence, the present invention provides two benefits: the overall temperature of the solid-state lamp 55 is decreased and the development of local hot-spots is inhibited, thereby improving the light output uniformity over the lifetime of the lamp.

Figure 4:
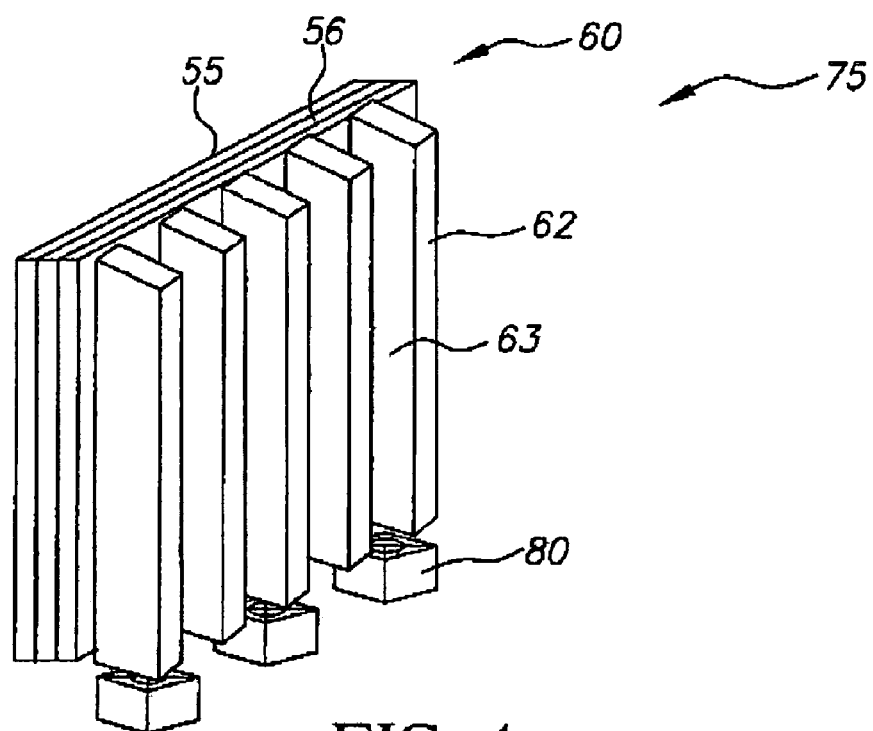
FIG. 4 is a perspective of another embodiment of an organic light-emitting diode lighting apparatus made in accordance with the present invention.

Referring to FIG. 4, there is illustrated a modified luminaire 75 made in accordance with the present invention, like numerals indicating like parts and operation as previously discussed. In this embodiment fins 62 have passageways 63 that are oriented vertically to promote convective cooling. In this arrangement, the natural upward flow of heated air through passageways 63 is aided by the vertical orientation of the fins. This natural flow of heated air may be further enhanced with the addition of forced-air convective cooling through and around fins 62, for example with fans 80. Forced-air convection may be employed in any orientation. In FIG. 4, an additional layer 56 made of a heat-conductive compliant material is provided to optimize the transfer of heat from the solid-state light source/lamp 55. Suitable materials for layer 56 comprising, for example, commercially available silicone pads, may be employed. Layer 56 is particularly useful in ensuring good thermal contact for a removable light source since the compliant material can be slightly compressed when the solid-state light source is inserted into a luminaire 75.

The heat-sink shown in FIG. 4 uses vertically oriented fins to complement a vertically-mounted lamp configuration. In alternative embodiments, the lamp may be mounted horizontally or at any other angle. The fins may be smooth, as shown, have cross-hatched openings in the fins, or have a variety of fin depths or thicknesses. In yet another embodiment, to reduce depth, fins may not be employed at all. A smooth surface or one with nodes, nodules, or pinheads, with a variety of shapes, for example cylinders, may be employed to improve air flow or convection. The heat sinks may be made of a variety of materials, for example materials having a coefficient of thermal expansion matched to the coefficient of thermal expansion of the lamp. Metals may be employed, for example Cu, Al, Si, Pb, or metal alloys, for example AlSi, AlSiC or steel.

Figure 5:
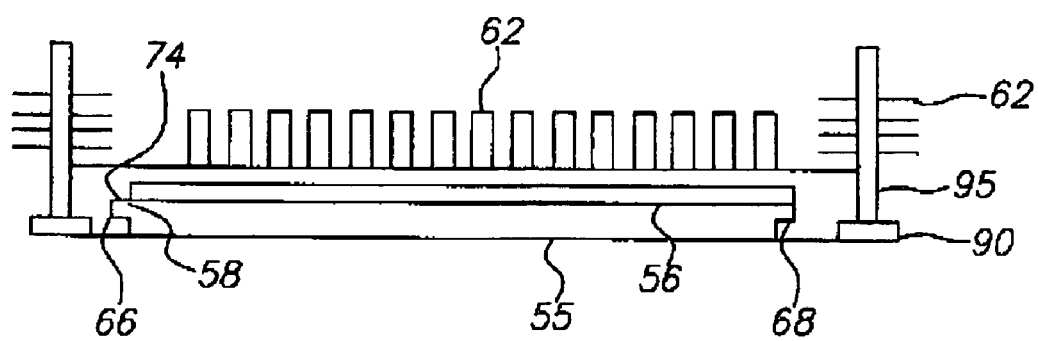
FIG. 5 is a cross section of another embodiment of an organic light-emitting diode lighting apparatus made in accordance with the present invention.
Figure 6:
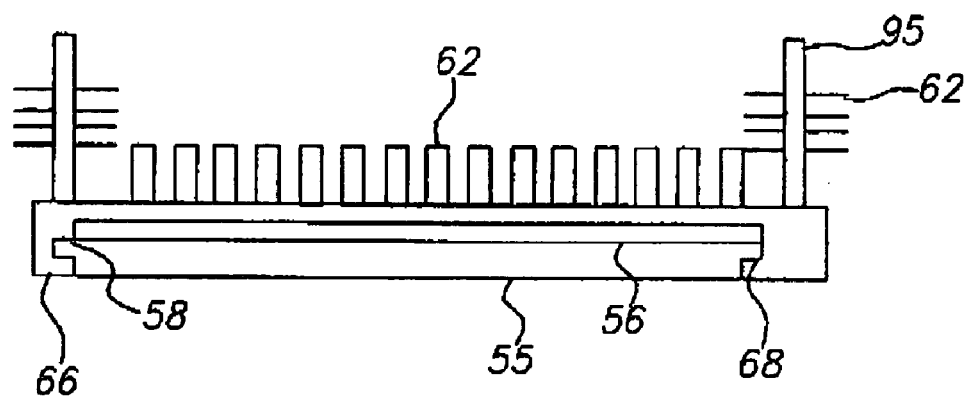
FIG. 6 is a cross section of an alternative embodiment of an organic light-emitting diode lighting apparatus made in accordance with the present invention.

A wide variety of mounting fixtures may be employed with the present invention. For example, suspended ceilings are typically made with a metal grid to support tiles and employ wire hangers to suspend the grid. Referring to FIG. 5, in an alternative embodiment of the present invention illustrated wherein the heat transfer unit 60 is thermally connected to a metal grid 90 that is suspended by wire hangers 95. In this embodiment, the heat transfer unit 60 serves as a heat-conductive socket (recess) with a detent 68 for holding the solid-state light source 55 in place and a cavity 66 for receiving a protruding tab 58 of the solid-state light source 55 and having electrical connectors (not shown), as described in U.S. Publication 2004/0060976 published Apr. 1, 2004 by Blazey. An electrical connection is provided from the electrical grid to the heat-conductive socket using a plug and wire as is well known (not shown). Heat radiating fins 62, as previously discussed, may be provided. In an alternative arrangement illustrated in FIG. 6, the heat transfer unit 60 is directly suspended by a hanger 95, preferably made of a heat conductive material, such as metal.

Figure 7:
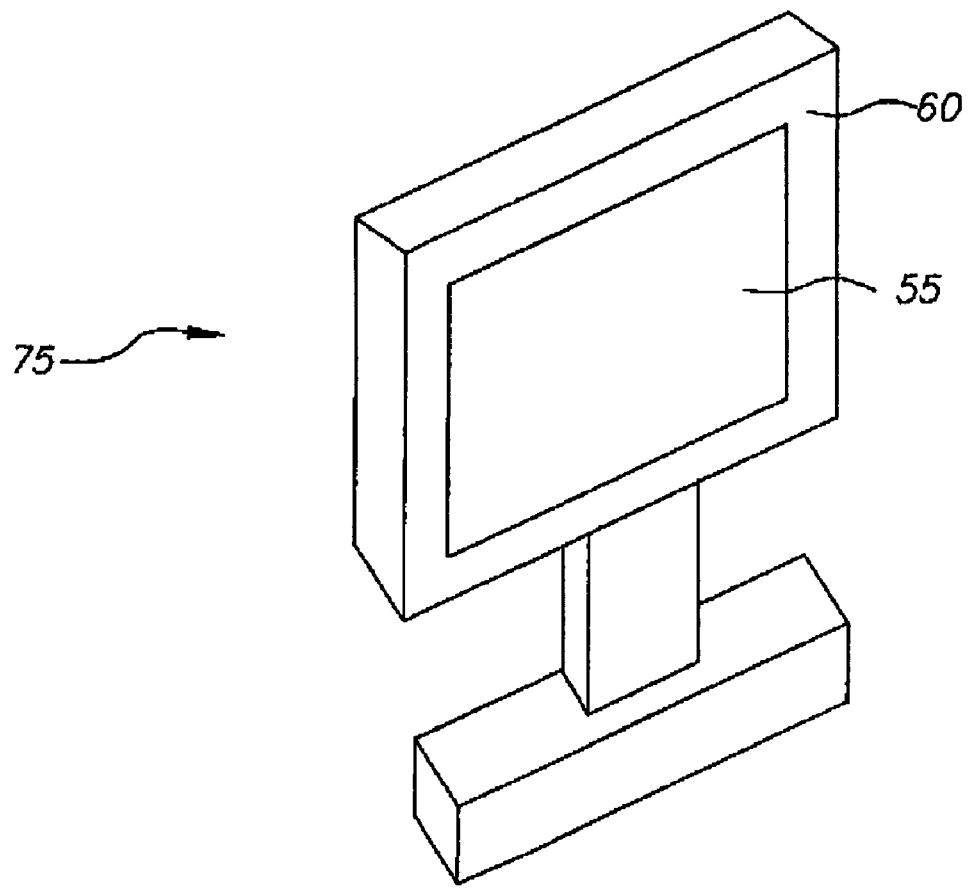
FIG. 7 is a perspective of yet another alternative embodiment of an organic light-emitting diode lighting apparatus made in accordance with the present invention.

Mounting fixtures may also stand-alone. Referring to FIG. 7, a luminaire 75 includes a thermally conductive heat transfer unit 60 that also serves as a support for a free-standing area illumination device, such as a lamp. As shown in FIG. 7, the thermally conductive heat transfer unit 60 is in substantial continuous thermal contact with the solid-state light lamp 55 over the coextensive mounting surface of the solid-state light source. Heat dissipating fins may be employed on the back side of the thermally conductive heat transfer unit 60.

Figure 8:
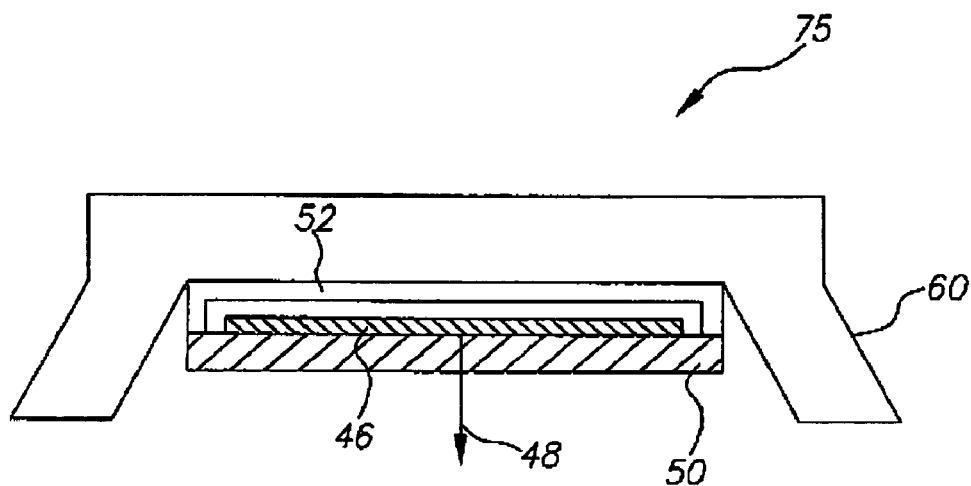
FIG. 8 is a cross section of yet another alternative embodiment of an organic light-emitting diode lighting apparatus made in accordance with the present invention.
Figure 9:
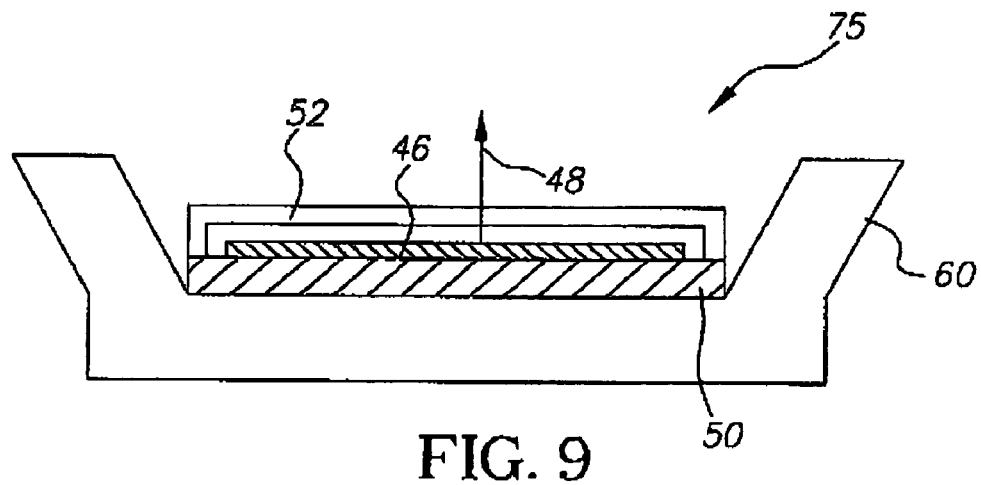
FIG. 9 is a cross section of still another alternative embodiment of an organic light-emitting diode lighting apparatus made in accordance with the present invention.
Figure 10:
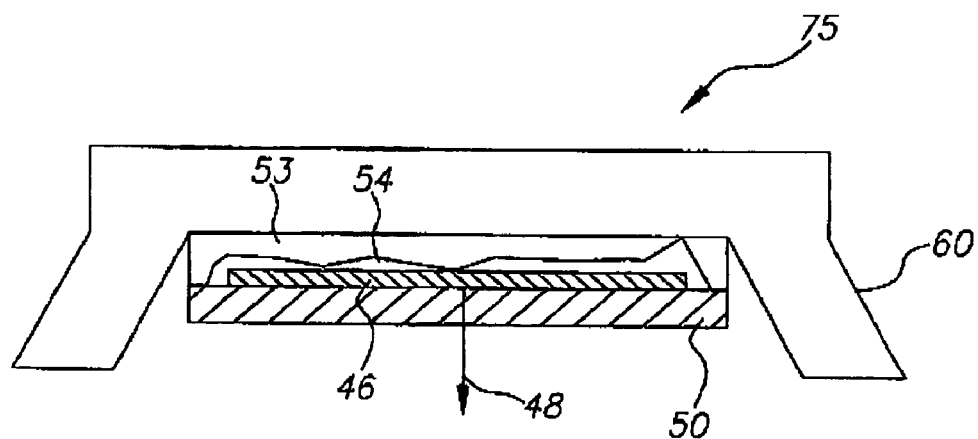
FIG. 10 is a cross section of yet still another alternative embodiment of an organic light-emitting diode lighting apparatus made in accordance with the present invention.

Referring to FIGS. 8, 9 and 10 there is illustrated still further embodiments of the present invention, like numerals indicating like parts and operation as previously discussed. In the embodiment of FIG. 8 the cover 52 is heat conductive and is secured to heat transfer unit 60. In FIG. 9 the substrate 50 is secured to the unit 60 wherein the unit 60 is in the inverted position for directing light 48 upwards. In FIG. 10 a pliable layer 53 of a heat conductive material is provided over the top of encapsulation layer 54. The encapsulation layer 54 also acts as a cover. The layer 53 is preferably designed to fill any void between encapsulation layer 54 and thermally conductive heat transfer unit 60 so as to provide a continuous thermal contact there between.

In further embodiments of the present invention, the thermally conductive heat transfer unit 60 may include additional active or passive cooling means such as are known in the art, for example Peltier coolers and heat pipes. Moreover, a heat-conductive compliant material, for example silicone, thermal paste, thermal adhesives, or thermal grease, may be employed between the substrate 50 or cover 52 to aid thermal transfer between the light emitters and the heat transfer unit 60. In yet another embodiment, a thermally conductive material may be employed within the gap between the OLED layers 46 and the encapsulating cover 52 to improve the transfer of heat out of the OLED device. In general, a thermally conductive material may be located between the thermally conductive mounting member and the thin-film light-emitting structure.

The invention has been described in detail with particular reference to certain preferred embodiments thereof, but it will be understood that variations and modifications can be effected within the spirit and scope of the invention.

PARTS LIST

5 Envelope
10 Filament
15 Filament support
20 Edison screw base
25 Cathode
30 Electron injection layer
35 Emitter layer
40 Hole injection layer
45 Anode
46 OLED layers
48 light
50 Substrate
52 cover
54 encapsulating layer
55 encapsulating layer
55 OLED lamp
56 layer
58 tab
60 Heat transfer unit
62 Fin
63 passageway
65 Decorative screen
66 cavity
68 detent
70 Mounting bracket
75 Luminaire
80 Fan
90 Ceiling grid
95 Hanger

What is claimed is:

1. An organic light-emitting diode lighting apparatus, comprising:
    an organic light-emitting diode lamp having a thermally conductive mounting member having a mounting surface on a first side, a light-emitting surface on a second side, and a thin-film light-emitting structure adjacent said light-emitting surface, said thin-film light-emitting structure comprising an anode, a light-emitting layer, and a cathode; and
    a thermally conductive mounting fixture for mounting to a wall ceiling, posts, or other point of fixtury said mounting fixture having a thermally conductive mounting surface on which said thermally conductive mounting member is secured such that there is substantially continuous thermal contact across said mounting surface.

2. The organic light-emitting diode lighting apparatus according to claim 1 wherein said mounting member is the substrate of the lamp.

3. The organic light-emitting diode lighting apparatus according to claim 1 wherein said thin-film light-emitting structure is mounted to said mounting member.

4. The organic light-emitting diode lighting apparatus according to claim 1 wherein said mounting member comprises a cover for said thin-film light-emitting structure.

5. The organic light-emitting diode lighting apparatus according to claim 4 wherein said thin-film emitting structure includes an encapsulation layer that forms a continuous surface.

6. The organic light-emitting diode lighting apparatus according to claim 5 wherein said encapsulation layer conforms to said continuous thermal contact across said mounting surface.

7. The organic light-emitting diode lighting apparatus according to claim 1 where said thermally conductive mounting fixture has a plurality of heat conductive fins.

8. The organic light-emitting diode lighting apparatus according to claim 7 wherein said plurality of fins utilizes convection to the ambient atmosphere.

9. The organic light-emitting diode lighting apparatus according to claim 8 wherein a fan is provided for providing convective cooling of said fins.

10. The organic light-emitting diode lighting apparatus according to claim 9 wherein said plurality of fins are provided with a passageway for allowing flow of a gas there through.

11. The organic light-emitting diode lighting apparatus according to claim 10 wherein said fins are oriented such said passageway is orientated in a substantially vertical direction.

12. The organic light-emitting diode lighting apparatus according to claim 1 wherein a heat conductive compliant layer is provided between said mounting surface on said thermally conductive mounting member and said mounting surface on said thermally conductive mounting fixture.

13. The organic light-emitting diode lighting apparatus according to claim 12 wherein the heat conductive compliant layer comprises one or more of the following: silicone, thermal paste, thermal adhesives, and thermal grease.

14. The organic light-emitting diode lighting apparatus according to claim 1 where the thin-film light-emitting structure comprises one or more organic light-emitting diodes.

15. The organic light-emitting diode lighting apparatus according to claim 1 wherein the heat-conductive mounting fixture comprises a dropped panel ceiling grid.

16. The organic light-emitting diode lighting apparatus of claim 1 wherein the coefficient of thermal expansion of the thermally conductive mounting fixture is matched to the thermally conductive mounting member.

17. The organic light-emitting diode lighting apparatus of claim 1 wherein a plurality of anodes, light-emitting layers, and cathodes are employed in stacks.

18. The organic light-emitting diode lighting apparatus of claim 1 wherein the thermally conductive mounting fixture contains decorative elements.

19. An organic light-emitting diode lighting apparatus, comprising:
   a) an organic light-emitting diode lamp having a thermally conductive mounting member having a mounting surface on a first side and second light-emitting surface and a thin-film light-emitting structure adjacent said second light-emitting surface, said thin-film light-emitting structure comprising an anode, a light-emitting layer, and a cathode; and
   b) a thermally conductive mounting fixture having a thermally conductive mounting surface on which said thermally conductive mounting member is secured such that there is substantially continuous thermal contact across said mounting surface, where thermally conductive mounting fixture has a plurality of heat conductive fins.

20. An organic light-emitting diode lighting apparatus, comprising:
   a) an organic light-emitting diode lamp having a thermally conductive mounting member having a mounting surface on a first side and second light-emitting surface and a thin-film light-emitting structure adjacent said second light-emitting surface, said thin-film light-emitting structure comprising an anode, a light-emitting layer, and a cathode; and
   b) a thermally conductive mounting fixture having a thermally conductive mounting surface on which said thermally conductive mounting member is secured such that there is substantially continuous thermal contact across said mounting surface, wherein a heat conductive compliant layer is provided between said mounting surface on said thermally conductive mounting member and said mounting surface on said thermally conductive mounting fixture.

21. An organic light-emitting diode lighting apparatus, comprising:
   a) an organic light-emitting diode lamp having a thermally conductive mounting member having a mounting surface on a first side and second light-emitting surface and a thin-film light-emitting structure adjacent said second light-emitting surface, said thin-film light-emitting structure comprising an anode, a light-emitting layer, and a cathode; and
   b) a thermally conductive mounting fixture having a thermally conductive mounting surface on which said thermally conductive mounting member is secured such that there is substantially continuous thermal contact across said mounting surface, wherein the heat-conductive mounting fixture comprises a dropped panel ceiling grid.

22. An organic light-emitting diode lighting apparatus, comprising:
   a) an organic light-emitting diode lamp having a thermally conductive mounting member having a mounting surface on a first side and second light-emitting surface and a thin-film light-emitting structure adjacent said second light-emitting surface, said thin-film light-emitting structure comprising an anode, a light-emitting layer, and a cathode; and
   b) a thermally conductive mounting fixture having a thermally conductive mounting surface on which said thermally conductive mounting member is secured such that there is substantially continuous thermal contact across said mounting surface, wherein the coefficient of thermal expansion of the thermally conductive mounting fixture is matched to the thermally conductive mounting member.

23. An organic light-emitting diode lighting apparatus, comprising:
   a) an organic light-emitting diode lamp having a thermally conductive mounting member having a mounting surface on a first side and second light-emitting surface and a thin-film light-emitting structure adjacent said second light-emitting surface, said thin-film light-emitting structure comprising an anode, a light-emitting layer, and a cathode; and
   b) a thermally conductive mounting fixture having a thermally conductive mounting surface on which said thermally conductive mounting member is secured such that there is substantially continuous thermal contact across said mounting surface, wherein a plurality of anodes, light-emitting layers, and cathodes are employed in stacks.

* * * * *